United States Patent
Isoda et al.

(10) Patent No.: US 11,404,098 B2
(45) Date of Patent: Aug. 2, 2022

(54) MEMORY DEVICE

(71) Applicants: Kioxia Corporation, Tokyo (JP); SK hynix Inc., Icheon-si (KR)

(72) Inventors: Taiga Isoda, Seoul (KR); Eiji Kitagawa, Seoul (KR); Young Min Eeh, Seongnam-si (KR); Tadaaki Oikawa, Seoul (KR); Kazuya Sawada, Seoul (KR); Jin Won Jung, Icheon-si (KR)

(73) Assignees: KIOXIA CORPORATION, Tokyo (JP); SK HYNIX INC., Icheon-si (KR)

( * ) Notice: Subject to any disclaimer, the term of this patent is extended or adjusted under 35 U.S.C. 154(b) by 17 days.

(21) Appl. No.: 17/016,256

(22) Filed: Sep. 9, 2020

(65) Prior Publication Data
US 2021/0287728 A1 Sep. 16, 2021

(30) Foreign Application Priority Data
Mar. 10, 2020 (JP) .............................. JP2020-040603

(51) Int. Cl.
| | |
|---|---|
| G11C 11/00 | (2006.01) |
| G11C 11/16 | (2006.01) |
| H01L 43/08 | (2006.01) |
| G01R 33/09 | (2006.01) |
| H01L 43/02 | (2006.01) |
| H01L 43/10 | (2006.01) |

(52) U.S. Cl.
CPC .......... *G11C 11/161* (2013.01); *G01R 33/093* (2013.01); *H01L 43/02* (2013.01); *H01L 43/08* (2013.01); *H01L 43/10* (2013.01)

(58) Field of Classification Search
CPC ......... H01L 43/02; H01L 43/08; H01L 43/10; G11C 11/161
See application file for complete search history.

(56) References Cited

U.S. PATENT DOCUMENTS

| | | | |
|---|---|---|---|
| 6,436,526 B1 | 8/2002 | Odagawa et al. | |
| 7,606,063 B2 * | 10/2009 | Shen | ...................... G11C 11/16 257/421 |

(Continued)

FOREIGN PATENT DOCUMENTS

JP     2016018964 A     2/2016

OTHER PUBLICATIONS

U.S. Appl. No. 16/813,827; First Named Inventor: Taiga Isoda; Title: "Magnetoresistive Memory Device"; filed Mar. 10, 2020.

(Continued)

*Primary Examiner* — Pho M Luu
(74) *Attorney, Agent, or Firm* — Holtz, Holtz & Volek PC

(57) ABSTRACT

A memory device includes a first ferromagnetic layer, an insulating layer above the first ferromagnetic layer, a second ferromagnetic layer above the insulating layer, a capping layer on an upper surface of the second ferromagnetic layer, and an electrode on an upper surface of the capping layer. The second ferromagnetic layer includes iron atoms. The capping layer includes one or more elements identical to one or more elements in the second ferromagnetic layer. The electrode includes one or more elements identical to one or more of the elements in the capping layer and includes a material having a Vickers hardness higher than a Vickers hardness of an iron atom.

20 Claims, 10 Drawing Sheets

(56) References Cited

U.S. PATENT DOCUMENTS

| | | |
|---|---|---|
| 7,672,093 B2 | 3/2010 | Horng et al. |
| 8,493,779 B2* | 7/2013 | Ranjan ................. H01F 41/303 |
| | | 365/171 |
| 8,692,342 B2 | 4/2014 | Oh et al. |
| 9,508,926 B2 | 11/2016 | Kitagawa et al. |
| 9,647,203 B2 | 5/2017 | Kitagawa et al. |
| 9,899,071 B2* | 2/2018 | Ma .......................... H01L 43/06 |
| 10,103,318 B2 | 10/2018 | Watanabe et al. |
| 10,170,519 B2 | 1/2019 | Eeh et al. |
| 10,263,178 B2 | 4/2019 | Sawada et al. |
| 10,388,343 B2 | 8/2019 | Oikawa et al. |
| 2013/0032910 A1* | 2/2013 | Jung ....................... H01L 43/08 |
| | | 257/421 |
| 2018/0277745 A1 | 9/2018 | Oikawa et al. |
| 2019/0296226 A1 | 9/2019 | Eeh et al. |
| 2020/0082857 A1 | 3/2020 | Eeh et al. |
| 2020/0091410 A1 | 3/2020 | Kitagawa et al. |
| 2020/0294567 A1 | 9/2020 | Oikawa et al. |
| 2020/0302987 A1 | 9/2020 | Sawada et al. |
| 2020/0303632 A1 | 9/2020 | Watanabe et al. |

OTHER PUBLICATIONS

U.S. Appl. No. 16/816,880; First Named Inventor: Tadaaki Oikawa; Title: "Magnetic Device"; filed Mar. 12, 2020.
U.S. Appl. No. 16/816,961; First Named Inventor: Kazuya Sawada; Title: "Magnetic Memory Device"; filed Mar. 12, 2020.
U.S. Appl. No. 17/016,230; First Named Inventor: Kazuya Sawada; Title: "Magnetic Memory Device"; filed Sep. 9, 2020.
U.S. Appl. No. 17/016,272; First Named Inventor: Hisanori Aikawa; Title: "Semiconductor Memory Device and Memory System"; filed Sep. 9, 2020.

* cited by examiner

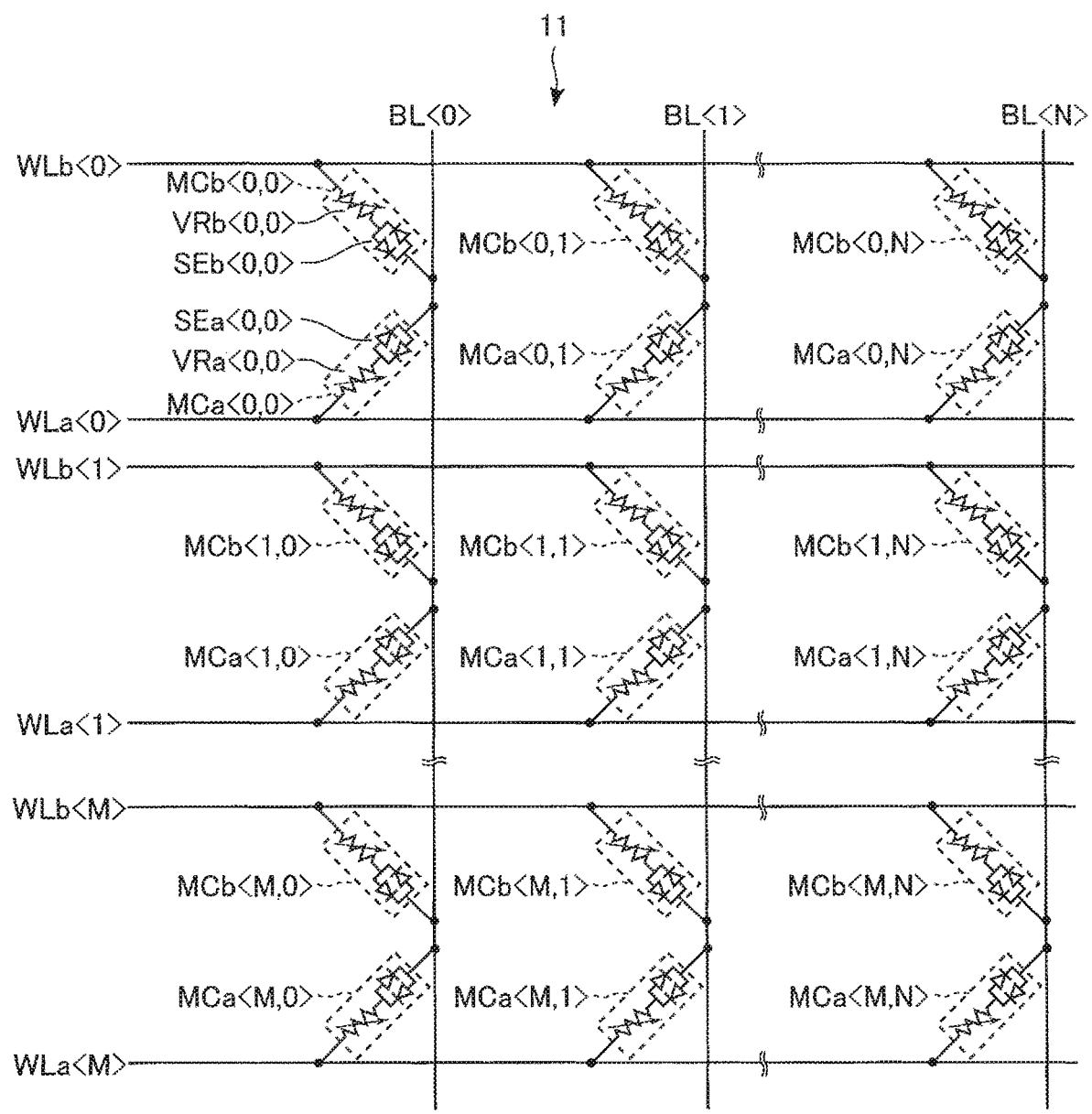
F I G. 2

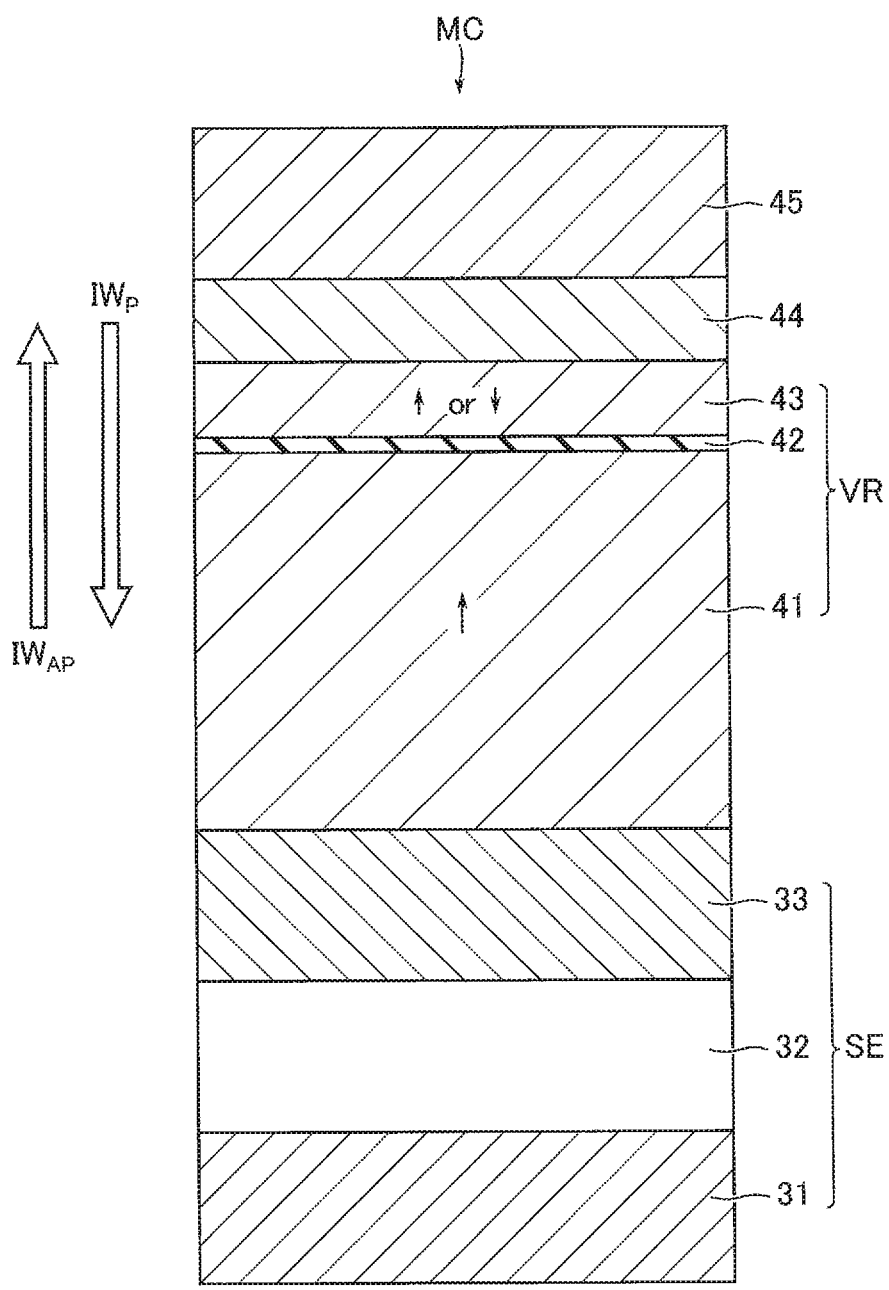
F I G. 4

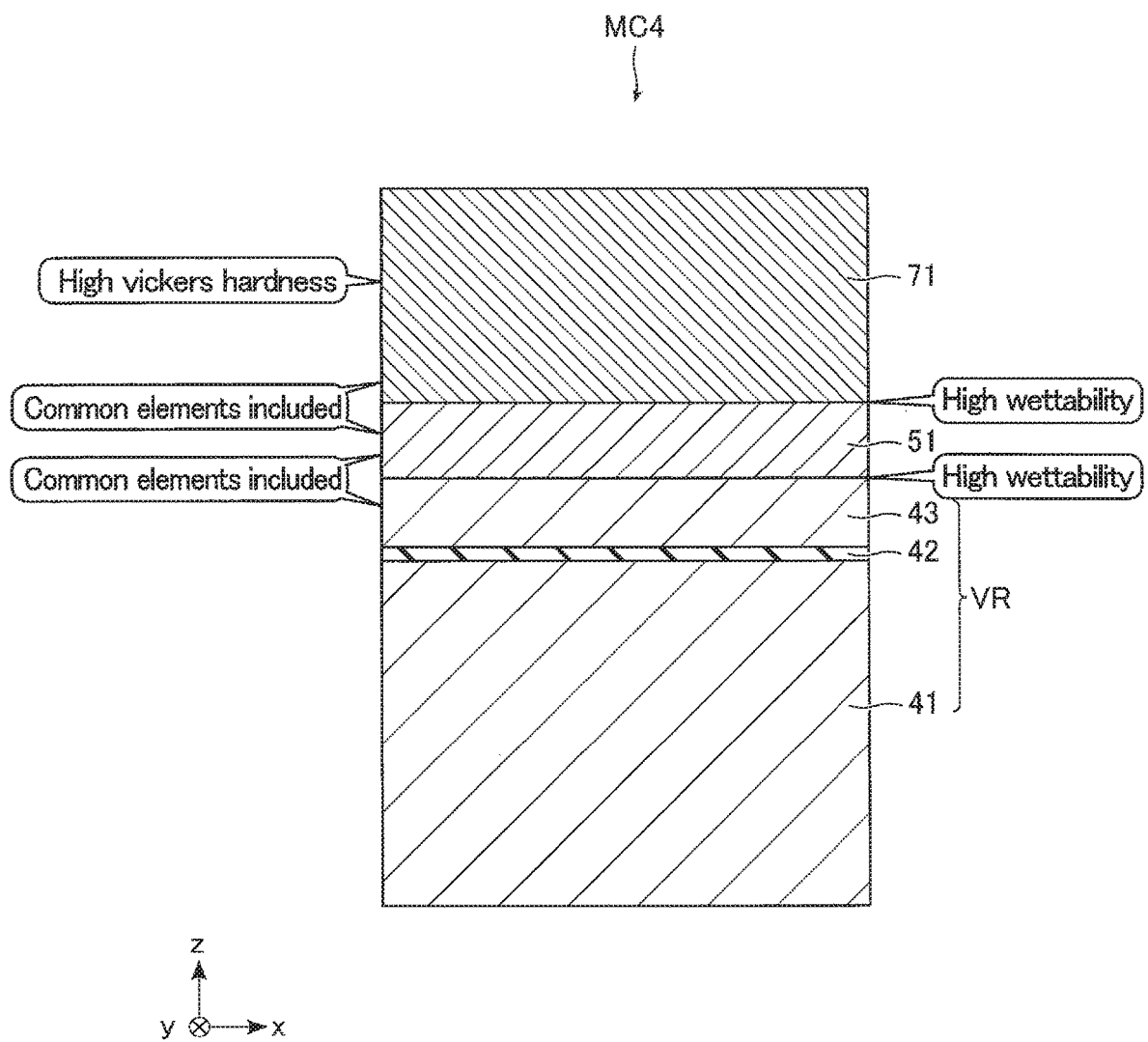
F I G. 10

MEMORY DEVICE

CROSS-REFERENCE TO RELATED APPLICATIONS

This application is based upon and claims the benefit of priority from Japanese Patent Application No. 2020-40603, filed Mar. 10, 2020, the entire contents of which are incorporated herein by reference.

FIELD

Embodiments described herein relate generally to a memory device.

BACKGROUND

Memory devices adopting a magnetoresistance effect element have been known.

BRIEF DESCRIPTION OF THE DRAWINGS

FIG. 2 is a circuit diagram of a memory cell array according to the first embodiment.

FIG. 4 is a cross-sectional view of an exemplary structure of the memory cell according to the first embodiment.

FIG. 10 is a cross-sectional view of an exemplary structure of a memory cell according to the fourth embodiment.

DETAILED DESCRIPTION

Figure 1:
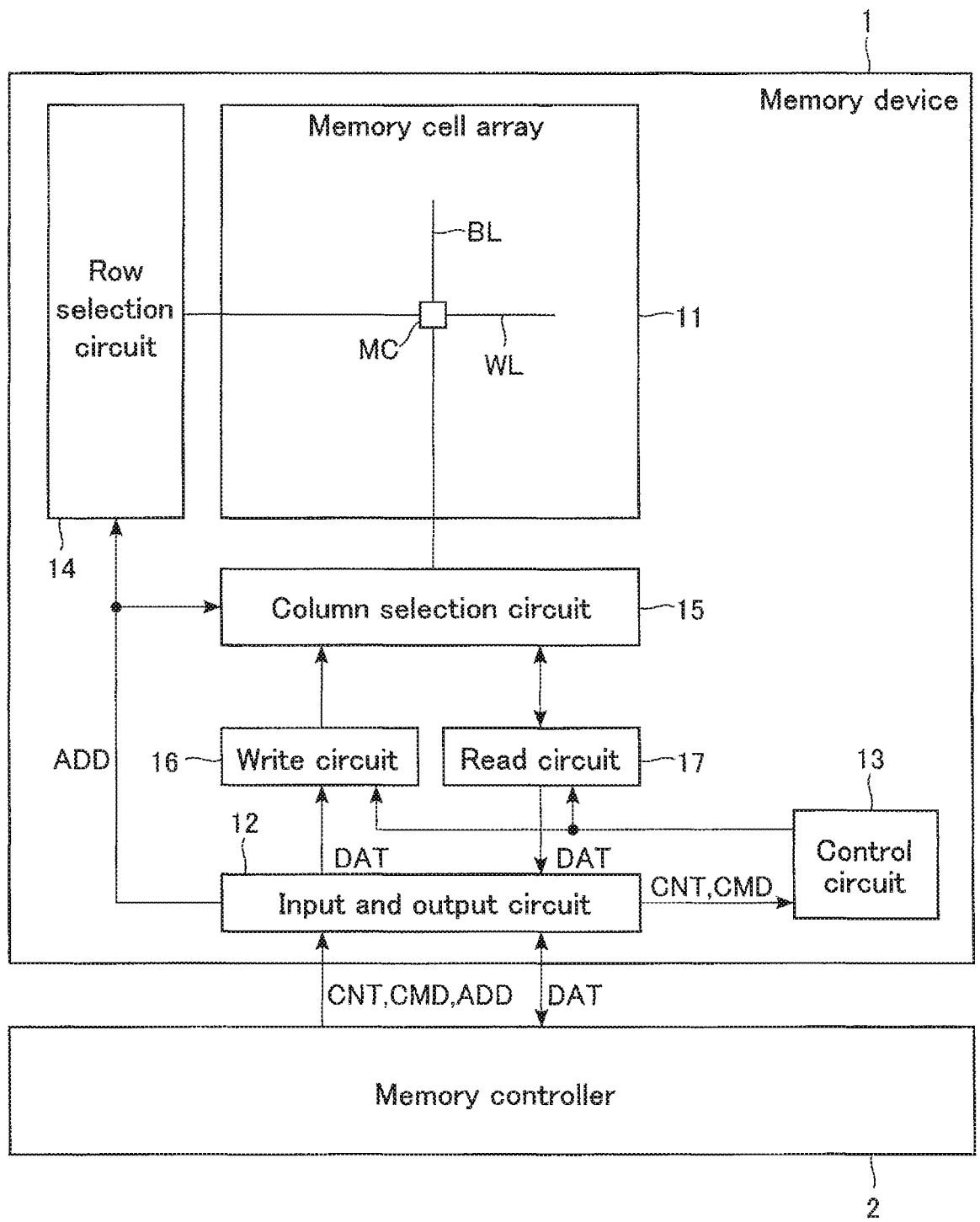
FIG. 1 is a functional block of a memory device according to the first embodiment.

In general, according to one embodiment, a memory device includes: a first ferromagnetic layer; an insulating layer above the first ferromagnetic layer; a second ferromagnetic layer above the insulating layer; a capping layer on an upper surface of the second ferromagnetic layer; and an electrode on an upper surface of the capping layer. The second ferromagnetic layer includes iron atoms. The capping layer includes one or more elements identical to one or more elements in the second ferromagnetic layer. The electrode including one or more elements identical to one or more of the elements in the capping layer and includes a material having a Vickers hardness higher than a Vickers hardness of an iron atom.

Embodiments will now be described with reference to the drawings. In the following description, components with substantially the same functions and configurations will be referred to with the same reference numerals, and the repetition of descriptions may be omitted. If components having substantially the same functions and configurations need to be differentiated from each other, distinguishing numerals or characters may be added to the end of the reference numerals.

The drawings are schematic, and the relations between the thickness and area of a plane of a layer and ratios of thicknesses of layers may differ from actual ones. Moreover, the drawings may include components which differ in relations and/or ratios of dimensions in different drawings. The entire description of a particular embodiment also applies to another embodiment unless explicitly mentioned otherwise or obviously eliminated. Each embodiment illustrates a device and method for materializing the technical idea of that embodiment, and the technical idea of an embodiment does not specify the quality of the material, shape, structure, or arrangement of components in the description below.

In the specification and the claims, a phrase in which a particular first component is "coupled" to another second component includes the first component being coupled to the second component either directly or via one or more components which are always or selectively conductive.

The embodiments will be described by using an xyz orthogonal coordinate system. In the description below, the term "below" as well as terms derived therefrom and terms related thereto refer to a position having a smaller coordinate on the z-axis, and the term "above" as well as terms derived therefrom and terms related thereto refer to a position having a larger coordinate on the z-axis.

First Embodiment

1. Structure (Configuration)

1.1. Overall Structure

FIG. 1 illustrates functional blocks of a memory device according to the first embodiment. As shown in FIG. 1, a memory device 1 includes a memory cell array 11, an input and output circuit 12, a control circuit 13, a row selection circuit 14, a column selection circuit 15, a write circuit 16, and a read circuit 17.

The memory cell array 11 includes memory cells MC, word lines WL, and circuit lines BL. The memory cell MC can store data in a non-volatile manner. Each memory cell MC is coupled to one word line WL and one bit line BL. Each word line WL s associated with a row, and each bit line BL is associated with a column. Through the se of one row and one or more columns, one or more memory cells MC are designated.

The input and output circuit 12 receives various types of a control signal CNT, various types of a command CMD, an address signal ADD, and data (write data) DAT, for example, from a memory controller 2, and transmits data (read data) DAT to, for example, the memory controller 2.

The row selection circuit 14 receives the address signal ADD from the input and output circuit 12, and brings one word line WL associated with the row that is specified by the received address signal ADD into a selected state.

The column selection circuit 15 receives the address signal ADD from the input and output circuit 12 and brings bit lines BL associated with the column that is specified by the received address signal ADD into a selected state.

The control circuit 13 receives the control signal CNT and the command CMD from the input and output circuit 12. The control circuit 13 controls the write circuit 16 and the read circuit 17 based on control instructed by the control signal CNT and the command CMD. Specifically, the control circuit 13 supplies voltages for data writing to the write circuit 16 during the data writing to the memory cell array 11. Further, the control circuit 13 supplies voltages for data reading to the read circuit 17 during the reading of data from the memory cell array 11.

The write circuit 16 receives write data DAT from the input and output circuit 12, and supplies the voltages for data writing to the column selection circuit 15 based on the control by the control circuit 13 and the write data DAT.

The read circuit 17 includes a sense amplifier, and, based on the control of the control circuit 13, the read circuit 17 uses the voltages for data reading to determine data stored in the memory cells MC. The determined data is supplied to the input and output circuit 12 as the read data DAT.

1.2. Circuit Configuration of Memory Cell Array

FIG. 2 is a circuit diagram of a memory cell array 11 according to the first embodiment. As shown in FIG. 2, the memory cell array 11 includes (M+1) word lines WLa (WLa<0>, WLa<1>, . . . , and WLa<M>) and (M+1) word lines WLb (WLb<0>, WLb<1≤, . . . , and WLb<M>), where M is a natural number. The memory cell array 11 also includes (N+1) bit lines BL (BL<0>, BL<1>, . . . , and BL<N>), where N is a natural number.

Each of the memory cells MC (MCa and MCb) includes two nodes: a first node coupled to one word line WL; and a second node coupled to one bit line BL. More specifically, the memory cells MCa include memory cells MCa<α, β> for any combination of α and β, where α is an integer equal to or greater than 0 and equal to or less than M, and β is an integer equal to or greater than 0 and equal to or less than N, and the memory cell MCa<α, β> is coupled between the word line WL<α> and the bit line BL<β>. Similarly, the memory cells Mob include memory cells MCb<α, β> for any combination of α and β, where α is an integer equal to or greater than 0 and equal to or less than M, and β is an integer equal to or greater than 0 and equal to or less than N, and the memory cell MCb<α, β> is coupled between the word line WLb<α> and the bit line BL<β>.

Each memory cell MC includes one magnetoresistance effect element VR (VRa or VRb) and one selector SE (SEa or SEb). More specifically, the memory cell MCa<α, β> includes a magnetoresistance effect element VRa<α, β>, and a selector SEa<α, β> for any combination of α and β, where α is an integer equal to or greater than 0 and equal to or smaller than M, and β is an integer equal to or greater than 0 and equal to or smaller than N.

Moreover, each memory cell MCb>α, β> includes a magnetoresistance effect element VRb<α, β> and a selector SEb>α, β< for any combination of α and β, where α is an integer equal to or greater than 0 and equal to or smaller than M, and β is an integer equal to or greater than 0 and equal to or smaller than N.

In each memory cell MC, the magnetoresistance effect element VR and the selector SE are coupled in series. The magnetoresistance effect element VR is coupled to one word line WL, and the selector SE is coupled to one bit line BL.

The magnetoresistance effect element VR is configured to switch between a low-resistance state and a high-resistance state. The magnetoresistance effect element VR is configured to store 1-bit data, utilizing the difference in the two resistance states.

The selector SE may be a switching element. The switching element includes two terminals, and, when a voltage smaller than a first threshold is applied in a first direction between the two terminals, the switching element is brought into a high-resistance state, i.e., an electrically non-conductive state (an OFF state). On the other hand, when a voltage equal to or greater than the first threshold is applied in the first direction between the two terminals, the switching element is brought into a low-resistance state, i.e., an electrically conductive state (an ON state). The switching element is further equipped with a function similar to the function of switching between the high-resistance state and the low-resistance state based on the magnitude of the voltage applied in the first direction, with respect to a second direction opposite to the first direction. By turning the switching element on or off, control can be performed as to whether or not to supply a current to a magnetoresistance effect element VR coupled to the switching element, namely, whether or not to select the magnetoresistance effect element VR.

1.3. Structure of Memory Cell Array

Figure 3:
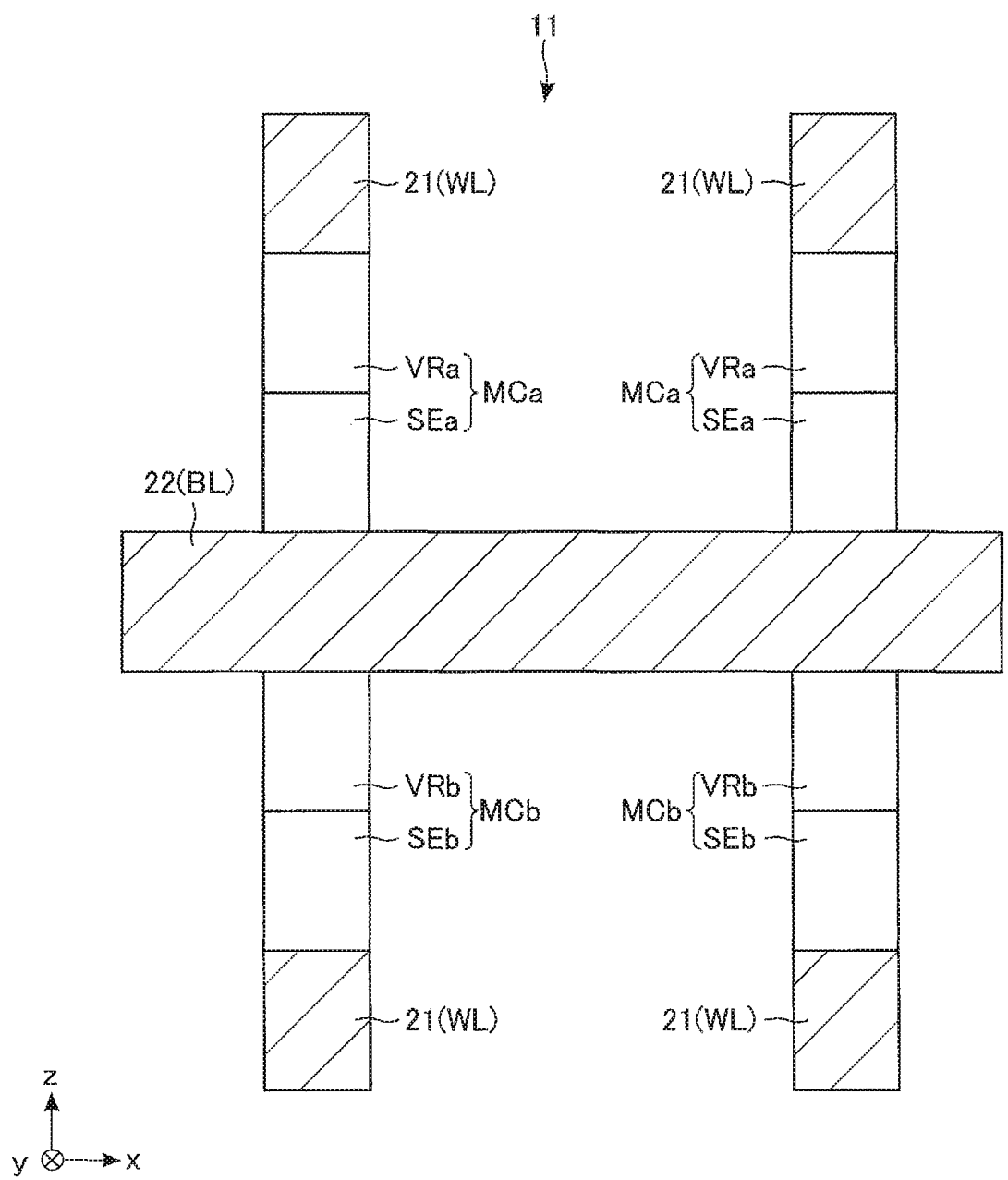
FIG. 3 is a diagram showing a cross sectional structure of part of the memory cell array according to the first embodiment.

FIG. 3 illustrates a cross-sectional structure of part of the memory cell array 11 according to the first embodiment.

As shown in FIG. 3, a plurality of conductors 21 are provided above a semiconductor substrate (not shown). The conductors 21 extend along the y-axis, and are aligned along the x-axis. Each conductor 21 functions as one word line WL.

Each conductor 21 is coupled, at its top surface, to the bottom surface of a corresponding one of memory cells MCb. The memory cells MCb are aligned along the y-axis on each conductor 21, and this arrangement provides a matrix of memory cells MCb. Each memory cell MC includes a structure that functions as a selector SE and a structure that functions as a magnetoresistance effect element VR. The structure that functions as a selector SE and the structure that functions as a magnetoresistance effect element VR each have one or more layers, as will be described later.

A plurality of conductors 22 are provided above the memory cells MCb. The conductors 22 extend along the x-axis, and are aligned along the y-axis. Each conductor 22 is coupled, at its bottom surface, to the top surfaces of the memory cells MCb aligned along the x-axis. Each conductor 22 functions as one bit line BL.

Each conductor 22 is coupled, at its top surface, to the bottom surfaces of a plurality of memory cells MCa. The memory cells MCa are aligned along the x-axis on each conductor 22, and this arrangement provides a matrix of memory cells MCa. A further conductor 21 is provided on the top surfaces of the memory cells MCa aligned along the y-axis. The memory cell array 11 as shown in FIG. 2 can be realized by repeating the structure of the lower-most layer of the conductor 21 up to the layer of the memory cells MCa shown in FIG. 2 along the z-axis.

The memory cell array 11 further includes an interlayer insulator in a region where the conductors 21, conductors 22, and memory cells MC are not provided.

1.4. Structure of Memory Cell

FIG. 4 shows a cross section of an exemplary structure of a memory cell MC according to the first embodiment. As illustrated in this drawing, the memory cell MC includes a selector SE, a magnetoresistance effect element VR on the selector SE, a capping layer 44, and an electrode 45. The selector SE includes a variable resistance material 32. The selector SE may further include a lower electrode 31 and an upper electrode 33, as illustrated in FIG. 4.

The variable resistance material 32 is, for example, a switching element between two terminals, the first of the two terminals corresponding to one of the top surface and bottom surface of the variable resistance material 32, the second of two terminals corresponding to the other one of the top surface and bottom surface of the variable resistance material 32. The variable resistance material 32 includes at least one of chalcogen elements selected from a group consisting of tellurium (Te), selenium (Se), and sulfur (S). Alternatively, the variable resistance material 32 may include chalcogenide, which is a compound including the above-described chalcogen element.

The magnetoresistance effect element VR exhibits a tunnel magnetoresistance effect, and includes a magnetic tunnel junction (MTJ). Specifically, a magnetoresistance effect element VR includes a ferromagnet (ferromagnetic layer) 41, an insulator (insulating layer) 42, and a ferromagnet (ferromagnetic layer) 43. The magnetoresistance effect element may be referred to as an MTJ element. For example, as shown in FIG. 4, the insulator 42 is on the top surface of the ferromagnet 41, and the ferromagnet 43 is on the top surface of the insulator 42.

The ferromagnet 41 has an easy magnetization axis in a direction (indicated by an arrow in the ferromagnet 41) penetrating the interfaces between the ferromagnet 41, the insulator 42, and the ferromagnet 43, for example at an angle from 45° to 90° with respect to the interfaces, or in a direction orthogonal to the interfaces. The direction of magnetization of the ferromagnet 41 is intended to remain unchanged even when data is read or written in the memory device 1. The ferromagnet 41 functions as a so-called reference layer. The ferromagnet 41 may include a plurality of layers. The ferromagnet 41 may have a synthetic antiferromagnetic (SAF) structure. In this case, the ferromagnet 41 includes two ferromagnets (ferromagnetic layers) and a conductor (conductive layer) between the two ferromagnets. The conductor incurs antiferromagnetic exchange coupling between the two ferromagnets.

The insulator 42 includes or is formed of, for example, magnesium oxide (MgO), and functions as a so-called "tunnel barrier".

The ferromagnet 43 includes or is formed of, for example, cobalt iron boron (CoFeB) or iron boride (FeB). The ferromagnet 43 has an easy magnetization axis in a direction (indicated by arrows in the ferromagnet 43) penetrating the interfaces of the ferromagnet 41, insulator 42, and ferromagnet 43, for example at an angle from 45° to 90° with respect to the interfaces, or in a direction orthogonal to the interfaces. With the magnetization direction of the ferromagnet 43 changeable by data writing, the ferromagnet 43 functions as a so-called "storage layer".

Hereinafter, the property of the ferromagnet 41 or ferromagnet 43 having an easy magnetization axis in a direction penetrating the interfaces of the ferromagnet 41, insulator 42, and ferromagnet 43, particularly at an angle from 45° to 90° formed with respect to the interfaces, is referred to as perpendicular magnetic anisotropy.

When the magnetization direction of the ferromagnet 43 is parallel to the magnetization direction of the ferromagnet 41, the variable resistance element VR is in a state of having a lower resistance. When the magnetization direction of ferromagnet 43 is anti-parallel to the magnetization direction of ferromagnet 41, the variable resistance element VR is in a state of having a higher resistance.

When a certain amount of write current $IW_P$ flows from the ferromagnet 43 to the ferromagnet 41, the magnetization direction of the ferromagnet 43 becomes parallel to the magnetization direction of the ferromagnet 41. In contrast, when a different amount of write current $IW_{AP}$ flows from the ferromagnet 41 to the ferromagnet 43, the magnetization direction of the ferromagnet 43 becomes anti-parallel to the magnetization direction of the ferromagnet 41.

The capping layer 44 is arranged on the top surface of the ferromagnet 43. The capping layer 44 is intended to absorb boron included in the ferromagnet 43, and therefore includes a material that can absorb boron. The material of the capping layer 44 which can absorb boron is non-stoichiometric. The electrode 45 is positioned on the upper surface of the capping layer 44. The characteristics of the capping layer 44 and electrode 45 will be further described with reference to FIG. 5.

Figure 5:
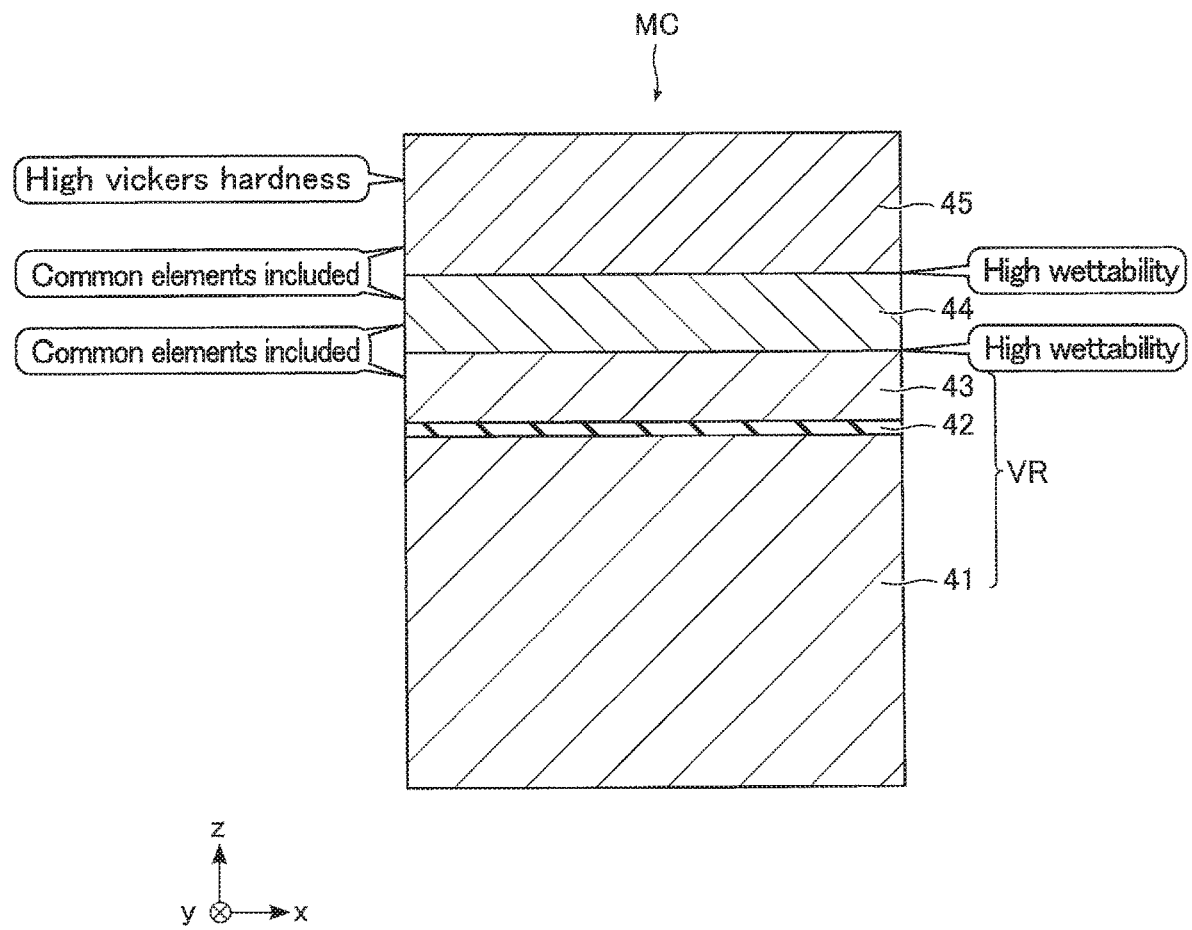
FIG. 5 is a diagram showing characteristics of part of the components of the memory cell according to the first embodiment.

FIG. 5 shows the properties of some of the components of the memory cell MC according to the first embodiment. As shown in this drawing, the capping layer 44 may include or be formed of a material that demonstrates a high wettability (low interfacial energy) with respect to the ferromagnet 43.

For instance, the capping layer 44 may include or be formed of an oxide, nitride or oxynitride of at least one of the elements included in the ferromagnet 43.

Alternatively, the capping layer 44 may include or be formed of an oxide, nitride or oxynitride of a compound of two or more elements included in the ferromagnet 43.

The capping layer 44 may include or be formed of an oxide, nitride or oxynitride of a mixed crystal of two or more elements of the ferromagnet 43.

The electrode 45 exhibits a Vickers hardness higher than that of Fe, and includes or is formed of a conductor having an excellent wettability with respect to the capping layer 44. A conductor adopted as the material for the electrode 45, as well as other electrodes of the later-described embodiments, or as the material for a capping layer indicates that the material demonstrates an electrical conductivity of $250 \times 10^4$/ $\Omega \cdot m$ or higher.

Examples of conductors having a high wettability with respect to the capping layer 44 include the following: The conductor adopted for the electrode 45 includes an oxide, nitride or oxynitride of at least one of the elements included in the capping layer 44. The electrode 45 includes an oxide, a nitride, or an oxynitride when the capping layer 44 includes an oxide, a nitride, or an oxynitride, respectively. Specifically, examples of the material used for the electrode 45 when the capping layer 44 includes or is formed of an oxide include RuOx, IrOx, and RhOx, where x is a natural number. Examples of the material of the electrode 45 include TiNx and ZrNx when the capping layer 44 includes or is formed of a nitride.

1.4. Advantages (Effects)

According to the first embodiment, a memory device 1 with magnetoresistance effect elements VR of a high magnetic property can be offered, escribed below.

A ferromagnet 43 (which functions as a storage layer) having a reduced thickness can increase the performance of the magnetoresistance effect elements VR. If the ferromagnet 43 is thinned, however, holes tend to be created in the surface of the ferromagnet 43, and the material of the ferromagnet 43 tends to clump together, which would increase the roughness of the surface of the ferromagnet 43. With the ferromagnet 43 having a greater roughness, the ferromagnets 43 of the memory cells MC tend to vary in the aspect of the performance in the memory cell array 11. One of the causes of holes and/or clumps in the ferromagnets 43 may be the ferromagnets 43 being under stress during a thermal processing of the magnetoresistance effect elements VR.

According to the first embodiment, the ferromagnet 43 and capping layer 44 exhibit a high wettability, the capping layer 44 and electrode 45 exhibit a high wettability, and the electrode 45 exhibits a high Vickers hardness. When two adjacent layers exhibit a high wettability, or, for example, the two layers include common elements, the two layers show high adhesiveness. This means that the ferromagnet 43 and capping layer 44 are in contact with high adhesiveness, and the capping layer 44 and electrode 45 are in contact with high adhesiveness. A high adhesiveness produces a large reciprocal influence between the capping layer 44 and electrode 45 at their interface. The atoms of the electrode 45, which has a high Vickers hardness, are displaced very little. This means that the atoms of the capping layer 44 are also displaced very little by the influence of the electrode 45. In addition, the ferromagnet 43 and capping layer 44 in contact with a high adhesiveness influence each other at the interface. The atoms of the ferromagnet 43, which is under a large influence of the capping layer 44 whose elements are displaced very little under a large influence of the electrode 45 having a high hardness, are displaced very little. This suppresses holes and atom clumping in the ferromagnet 43. This suppression in turn suppresses the magnetic property of the ferromagnet 43, which tends to deteriorate due to holes and atom clumping, from deteriorating. Thus, memory cells MC with an excellent magnetic property can be realized.

Second Embodiment

The second embodiment differs from the first embodiment in the structure of a memory cell MC, and the rest of the second embodiment is the same as the first embodiment. The configuration of the second embodiment that differs from that of the first embodiment will be focused on below.

2.1. Structure (Configuration)

Figure 6:
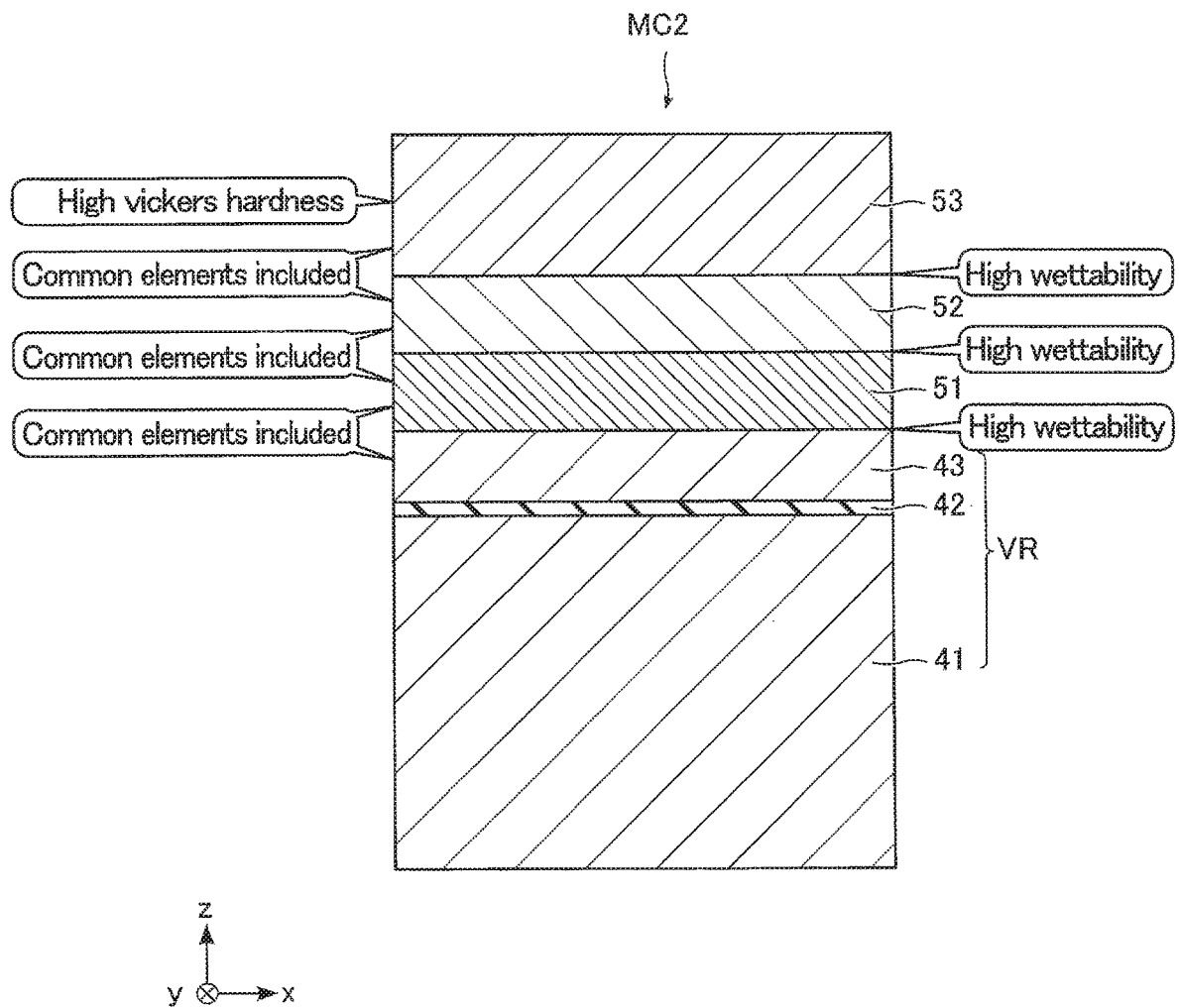
FIG. 6 is a cross-sectional view of an exemplary structure of a memory cell according to the second embodiment.

FIG. 6 shows a cross section of the structure of a memory cell MC according to the second embodiment. To distinguish from the memory cell MC of the first embodiment, the memory cell MC according to the second embodiment may be referred to as a "memory cell MC2". As illustrated in FIG. 6, in addition to the components of the memory cell MC, the memory cell MC2 includes an intermediate layer 51, and also a capping layer 52 and an electrode 53 in place of the capping layer 44 and electrode 45 of the memory cell MC.

The intermediate layer 51 is arranged on the upper surface of the ferromagnet 43. The intermediate layer 51 may include or be formed of a material that demonstrates a high wettability with respect to the ferromagnet 43. The intermediate layer 51 may have characteristics similar to those of the capping layer 44 of the first embodiment, and the characteristics of the intermediate layer 51 may include at least one of the characteristics of the capping layer 44 of the first embodiment.

In particular, the intermediate layer 51 may include or be formed of an oxide, nitride or oxynitride of at least one of the elements included in the ferromagnet 43.

The capping layer 52 is arranged on the upper surface of the intermediate layer 51. The capping layer 52 is similar to the capping layer 44 of the first embodiment, with some differences. Similarly to the capping layer 44, the capping layer 52 is also intended to absorb boron contained in the ferromagnet 43, and therefore includes a material that can absorb boron.

The capping layer 52 may include or be formed of a material that exhibits a high wettability with respect to the intermediate layer 51 and also to the electrode 53. To achieve a high wettability with respect to the intermediate layer 51, the capping layer includes or is formed of an oxide, nitride or oxynitride. Specifically, when the intermediate layer 51 includes or is formed of an oxide, the capping layer 52 also includes or is formed of an oxide. When the intermediate layer 51 includes or is formed of a nitride, the capping layer 52 also includes or is formed of a nitride. When the intermediate layer 51 includes or is formed of an oxynitride, the capping layer 52 also includes or is formed of an oxynitride.

In particular, the capping layer 52 may include or be formed of an oxide, nitride, or oxynitride of at least one from a group of titanium (Ti), zirconium (Zr), tantalum (Ta), tungsten (W), molybdenum (Mo), silicon (Si), boron (B), iron (Fe), cobalt (Co), nickel (Ni), hafnium (Hf), vanadium (V), niobium (Nb), chrome (Cr), aluminum (Al), scandium (Sc), yttrium (Y) and gadolinium (Gd), a compound of at least two from the group, or a mixed crystal of at least two from the group.

The capping layer 52 exhibits a high wettability with respect to the intermediate layer 51 and also to the electrode 53, thereby showing a high adhesiveness both to the intermediate layer 51 and to the electrode 53.

The electrode 53 has characteristics identical to or similar to the electrode 45 of the first embodiment. In particular, the electrode 53 includes or is formed of a conductor having a high wettability with respect to the capping layer 52, which is in contact with the bottom surface of the electrode 53, and the electrode 53 exhibits a high Vickers hardness. The difference between the electrode 53 and the electrode 45 is as follows. The electrode 53 may contain common elements included in a component with which the electrode 53 is in contact at the bottom surface thereof in order to achieve a high wettability with respect the component, and the same applies to the electrode 45, and therefore the electrode 53 and the electrode 45 may contain different elements from each other, in accordance with the material of the corresponding component (capping layer 44 or 52) in contact with the bottom surface thereof. The electrode 53 exhibits a high wettability with respect to the capping layer 52, and therefore exhibits an excellent adhesiveness with respect to the capping layer 52.

2.2. Manufacturing Method

The structure of FIG. 6 including the ferromagnet 43, intermediate layer 51, capping layer 52, and electrode 53 can be manufactured in this order with any method.

Figure 7:
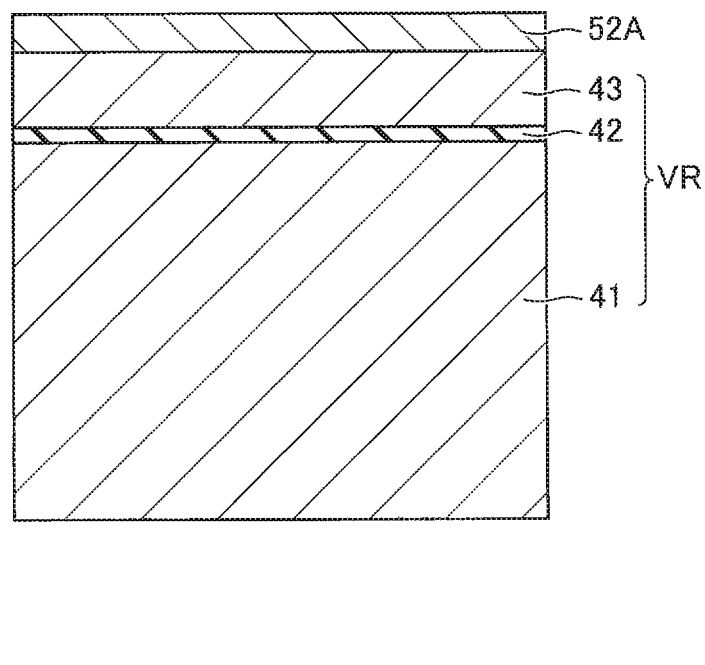
FIG. 7 is a diagram showing one step of an exemplary process of producing the memory cell according to the second embodiment.
Figure 8:
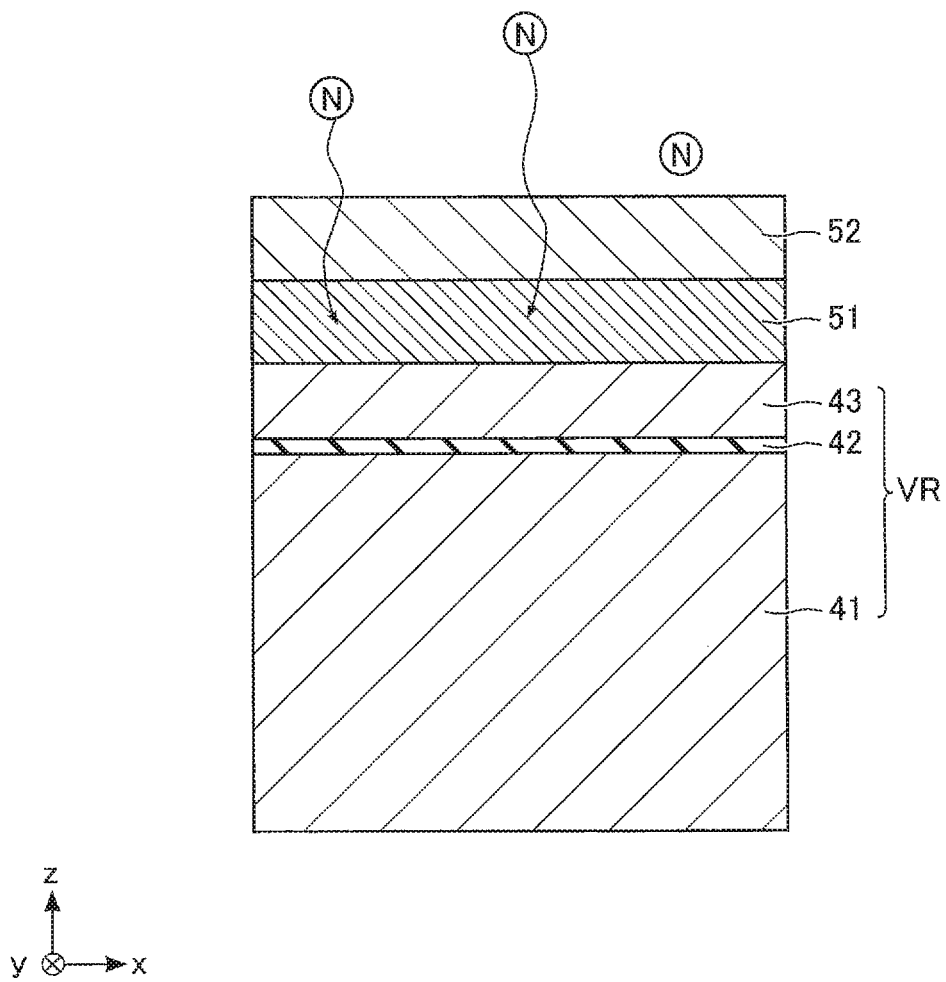
FIG. 8 is a diagram showing another step of the exemplary process of producing the memory cell according to the second embodiment.

The structure of FIG. 6 may be manufactured in the following method. FIGS. 7 and 8 each show a step of an exemplary method of manufacturing a memory cell MC2 according to the second embodiment. The portion of the memory cell MC2 according to the second embodiment that is the same as that of the structure of FIG. 6 is illustrated in FIGS. 7 and 8, where the step of FIG. 8 follows that of FIG. 7.

As illustrated in FIG. 7, the ferromagnet 41, insulator 42 and ferromagnet 43 are formed in this order. Thereafter, a capping layer 52A is formed on the upper surface of the ferromagnet 43. The capping layer 52A is part of the capping layer 52, or in other words, FIG. 7 shows an initial stage of the formation of the capping layer 52. The capping layer 52 (52A) is formed inside a chamber under an atmosphere containing elements included in the intermediate layer 51. For instance, when the intermediate layer 51 includes a nitride, the capping layer 52 is formed in a chamber under a nitrogen atmosphere.

As illustrated in FIG. 8, the process at the step of FIG. 7 is continued to form a capping layer 52. Through the adjustment of a gas for formation of the capping layer 52 and/or formation conditions (e.g., temperature and gas density inside the chamber, and/or processing time) during the formation, atoms of nitrogen undergo a reaction at the interface of the capping layer 52A and ferromagnet 43. The atoms of nitrogen incur reaction with the ferromagnet 43 even in the case of the ferromagnet 43 having an FCB structure that allows the ferromagnet 43 to have a high magnetic property. Through the reaction of the nitrogen, an intermediate layer 51 is formed between the capping layer 52A and ferromagnet 43. Furthermore, the process at the step of FIG. 8 is continued to form a capping layer 52.

Thereafter, the electrode 53 is formed in a manner similar to FIG. 6.

2.3. Advantages

According to the second embodiment, the ferromagnet 43 and intermediate layer 51 exhibit a high wettability, the intermediate layer 51 and capping layer 52 exhibit a high wettability, and the capping layer 52 and electrode 53 exhibit a high wettability. In such a structure, the ferromagnet 43 is easily affected by the electrode 53 through the capping layer 52 and intermediate layer 51. Furthermore, the electrode 53 exhibits a high. Vickers hardness in addition to its boron absorptive ability. The can be transmitted to the ferromagnet 43 via the capping layer 52 and the intermediate layer 51. This suppresses holes and atom clumping in the ferromagnet 43. Thus, the memory cell MC2 having a high magnetic property can be realized in the same manner as in the first embodiment.

Third Embodiment

The third embodiment differs from the first embodiment in the structure of a memory cell MC, and the rest of the third embodiment is the same as the first embodiment. The configuration of the third embodiment that differs from that of the first embodiment will be focused on below. To distinguish from the memory cell MC of the first embodiment, the memory cell MC according to the third embodiment may be referred to as a "memory cell MC3".

Figure 9:
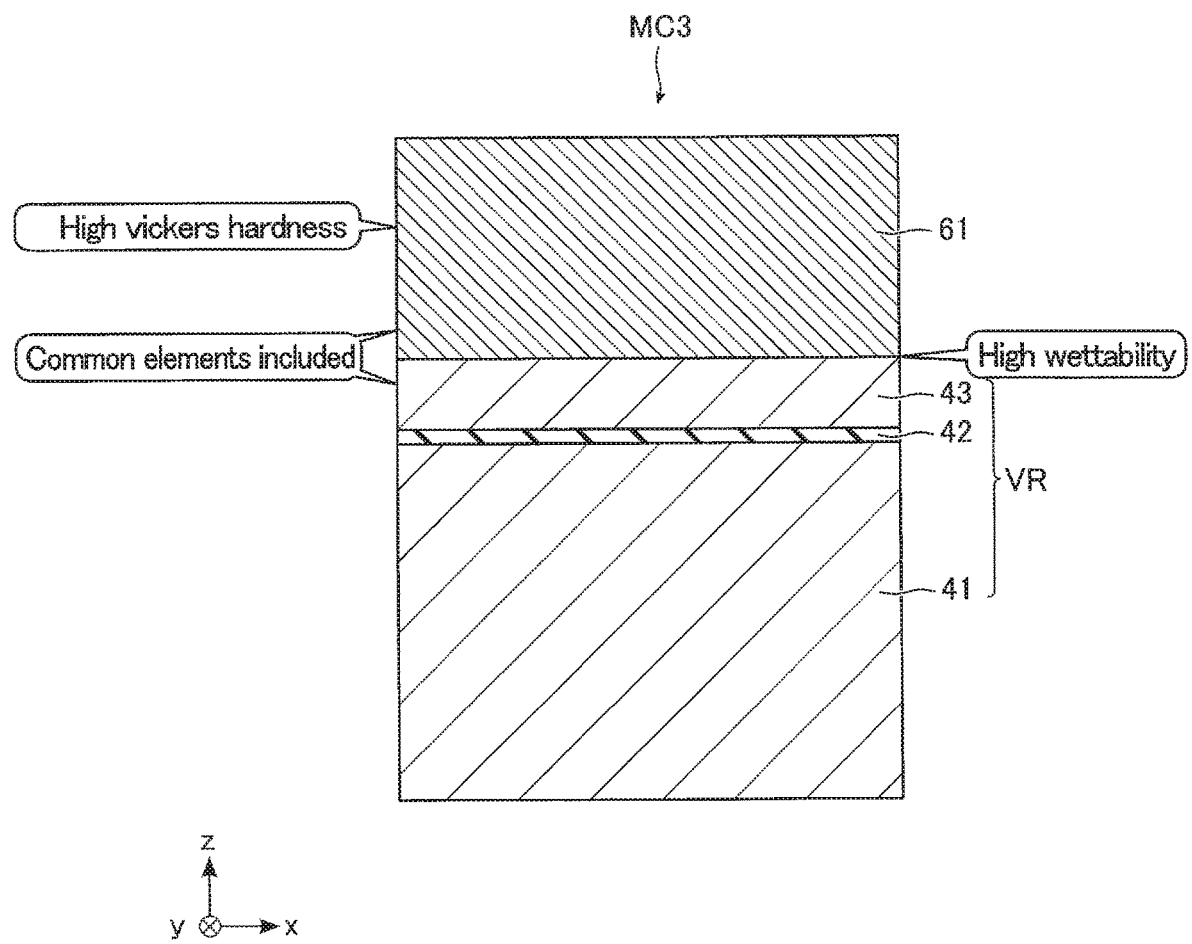
FIG. 9 is a cross-sectional view of an exemplary structure of a memory cell according to the third embodiment.

FIG. 9 shows an exemplary cross section of the memory cell MC3 according to the third embodiment. As illustrated in FIG. 9, the memory cell MC3 includes a capping layer 61 in place of the capping layer 44 and electrode 45 in the memory cell MC according to the first embodiment.

The capping layer 61 is arranged on the upper surface of the ferromagnet 43. The capping layer 61 has the characteristics of both the capping layer 44 and electrode 45 of the first embodiment. That is, the capping layer 61 has the functions of the capping layer 44 and the electrode 45, and includes or is formed of conductor that can absorb boron and has a high Vickers hardness.

Furthermore, the capping layer 61 includes or is formed of a material that exhibits a high wettability with respect to the ferromagnet 43. That is, in relation to the high wettability with respect to the ferromagnet 43, the characteristics of the capping layer 61 are similar to those of the capping layer 44 of the first embodiment.

In particular, the capping layer 61 may include or be formed of an oxide, nitride or oxynitride of at least one of the elements included in the ferromagnet 43.

Alternatively, the capping layer 61 may include or be formed of an oxide, nitride or oxynitride of a compound of two or more elements included in the ferromagnet 43.

The capping layer 61 may include or be formed of an oxide, nitride or oxynitride of a mixed crystal of two or more elements included in the ferromagnet 43.

To realize the above characteristics, the capping layer 61 may include FeOx (e.g., magnetite or iron oxide ($Fe_2O_3$)), TiBx, ZrOx, HfBx, VBx, NbBx, TaBx, CrBx, MoBx, and WBx.

According to the third embodiment, the capping layer 61 exhibits a high wettability with respect to the ferromagnet 43. In such a structure, the ferromagnet 43 is easily affected by the capping layer 61. The capping layer 61 further exhibits, in addition to its function as an electrode and its ability to absorb boron, a high Vickers hardness. This suppresses the atom displacement in the capping layer 61, and this suppression is conveyed to the ferromagnet 43, suppressing holes and/or atom clumping in the ferromagnet 43. Thus, the memory cell MC3 having a high magnetic property can be realized in the same manner as in the first embodiment.

Fourth Embodiment

The fourth embodiment differs from the first embodiment in the structure of a memory cell MC. The fourth embodiment is similar to the third and second embodiments, and corresponds to a combination of the third and second embodiments. The rest of the fourth embodiment is the same as the first embodiment. The configuration of the fourth embodiment that differs from that of the first embodiment will be focused on below. To distinguish from the memory cell MC of the first embodiment, the memory cell MC according to the fourth embodiment may be referred to as a "memory cell MC4".

FIG. 10 shows an exemplary cross section of the memory cell MC4 according to the fourth embodiment. As illustrated in this drawing, the memory cell MC4 includes the intermediate layer 51 of the second embodiment and a capping layer 71, in place of the capping layer 44 and electrode 45 in the memory cell MC according to the first embodiment.

The intermediate layer 51 is arranged on the upper surface of the ferromagnet 43. The intermediate layer 51 exhibits a high wettability with respect to the ferromagnet 43, as described in the second embodiment with reference to FIG. 6.

The capping layer 71 is arranged on the upper surface of the intermediate layer 51. The capping layer 71 has the characteristics of both the capping layer 44 and the electrode 45 of the first embodiment, in the same manner as the capping layer 52 of the second embodiment. That is, the capping layer 71 has the functions of the capping layer 44 and the electrode 45, and includes or is formed of a conductor capable of absorbing boron and having a high Vickers hardness.

Furthermore, the capping layer 71 includes or is formed of a material having a high wettability with respect to the intermediate layer 51. That is, the characteristics of the capping layer 71 are similar to those of the capping layer 52 of the second embodiment in relation to the high wettability with respect to the ferromagnet 43. Specifically, when the intermediate layer 51 includes or is formed of an oxide, the capping layer 71 also includes or is formed of an oxide. When the intermediate layer 51 includes or is formed of a nitride, the capping layer 71 also includes or is formed of a nitride. When the intermediate layer 51 includes or is formed of an oxynitride, the capping layer 71 also includes or is formed of an oxynitride. In particular, the capping layer 71 includes or is formed of a material used for the capping layer 52.

To realize the above characteristics, the capping layer 71 may include at least one of RuOx, IrOx, RhOx, TiNx, and ZrNx.

According to the fourth embodiment, the ferromagnet 43 and intermediate layer 51 exhibit a high wettability, and the intermediate layer 51 and capping layer 71 exhibit a high wettability. In such a structure, the ferromagnet 43 is easily affected by the capping layer 71 through the intermediate layer 51. In addition, the capping layer 71 exhibits a high Vickers hardness. This suppresses the atom displacement in the capping layer 71, and this suppression is conveyed to the ferromagnet 43 through the intermediate layer 51, suppressing holes and/or atom clumping in the ferromagnet 43. Thus, the memory cell MC4 having a high magnetic property can be realized in the same manner as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first ferromagnetic layer;
an insulating layer above the first ferromagnetic layer;
a second ferromagnetic layer above the insulating layer, the second ferromagnetic layer including iron atoms;
a capping layer on an upper surface of the second ferromagnetic layer, the capping layer including one or more elements identical to one or more elements in the second ferromagnetic layer; and
an electrode on an upper surface of the capping layer, the electrode including one or more elements identical to one or more of the elements in the capping layer and including a material having a Vickers hardness higher than a Vickers hardness of an iron atom,
wherein the capping layer includes an oxide, a nitride, or an oxynitride of one or more elements in the second ferromagnetic layer; an oxide, a nitride, or an oxynitride of a compound of two or more elements in the second ferromagnetic layer; or an oxide, a nitride, or an oxynitride of a mixed crystal of two or more elements in the second ferromagnetic layer.

2. The device according to claim 1, wherein:
the second ferromagnetic layer further includes boron atoms, and
the capping layer is capable of absorbing boron atoms.

3. The device according to claim 1, wherein the electrode includes an oxide or nitride.

4. The device according to claim 1, wherein:
the capping layer includes an oxide of one or more elements in the second ferromagnetic layer, an oxide of a compound of two or more elements in the second ferromagnetic layer, or an oxide of a mixed crystal of two or more elements in the second ferromagnetic layer, and
the electrode includes an oxide.

5. The device according to claim 1, wherein:
the capping layer includes a nitride of one or more elements in the second ferromagnetic layer, a nitride of a compound of two or more elements in the second ferromagnetic layer, or a nitride of a mixed crystal of two or more elements in the second ferromagnetic layer, and
the electrode includes a nitride.

6. A memory device, comprising:
a first ferromagnetic layer;
an insulating layer above the first ferromagnetic layer;
a second ferromagnetic layer above the insulating layer, the second ferromagnetic layer including iron atoms;
an intermediate layer on an upper surface of the second ferromagnetic layer, the intermediate layer including one or more elements identical to one or more elements in the second ferromagnetic layer;
a capping layer on an upper surface of the intermediate layer, the capping layer including one or more elements identical to one or more of the elements in the intermediate layer; and
an electrode on an upper surface of the capping layer, the electrode including one or more elements identical to one or more of the elements in the capping layer and including a material having a Vickers hardness higher than a Vickers hardness of an iron atom.

7. The device according to claim 6, wherein:
the second ferromagnetic layer further includes boron atoms, and
the capping layer is capable of absorbing boron atoms.

8. The device according to claim 7, wherein:
the intermediate layer includes an oxide, a nitride, or an oxynitride of one or more elements in the second ferromagnetic layer, and
the capping layer includes an oxide, a nitride, or an oxynitride.

9. The device according to claim 7, wherein:
the intermediate layer includes an oxide of one or more elements in the second ferromagnetic layer, and the capping layer includes an oxide,
the intermediate layer includes a nitride of one or more elements in the second ferromagnetic layer, and the capping layer includes a nitride, or
the intermediate layer includes an oxynitride of one or more elements in the second ferromagnetic layer, and the capping layer includes an oxynitride.

10. The device according to claim 6, wherein:
the intermediate layer includes an oxide, a nitride, or an oxynitride of one or more elements in the second ferromagnetic layer, and
the capping layer includes an oxide, a nitride, or an oxynitride.

11. The device according to claim 6, wherein:
the intermediate layer includes an oxide of one or more elements in the second ferromagnetic layer, and the capping layer includes an oxide,
the intermediate layer includes a nitride of one or more elements in the second ferromagnetic layer, and the capping layer includes a nitride, or
the intermediate layer includes an oxynitride of one or more elements in the second ferromagnetic layer, and the capping layer includes an oxynitride.

12. A memory device comprising:
a first ferromagnetic layer;
an insulating layer above the first ferromagnetic layer;
a second ferromagnetic layer above the insulating layer, the second ferromagnetic layer including iron atoms; and
a conductive capping layer on an upper surface of the second ferromagnetic layer, the capping layer including one or more elements identical to one or more elements in the second ferromagnetic layer, and including a material having a Vickers hardness higher than a Vickers hardness of an iron atom,
wherein the capping layer includes an oxide, a nitride, or an oxynitride of one or more elements in the second ferromagnetic layer; an oxide, a nitride, or an oxynitride of a compound of two or more elements in the second ferromagnetic layer; or an oxide, a nitride, or an oxynitride of a mixed crystal of two or more elements in the second ferromagnetic layer.

13. The device according to claim 12, wherein:
the second ferromagnetic layer further includes boron atoms, and
the capping layer is capable of absorbing boron atoms.

14. The device according to claim 12, wherein:
the capping layer includes an oxide of one or more elements in the second ferromagnetic layer, an oxide of a compound of two or more elements in the second ferromagnetic layer, or an oxide of a mixed crystal of two or more elements in the second ferromagnetic layer, and
the electrode includes an oxide.

15. The device according to claim 12, wherein:
the capping layer includes a nitride of one or more elements in the second ferromagnetic layer, a nitride of a compound of two or more elements in the second ferromagnetic layer, or a nitride of a mixed crystal of two or more elements in the second ferromagnetic layer, and
the electrode includes a nitride.

16. A memory device comprising:
a first ferromagnetic layer;
an insulating layer above the first ferromagnetic layer;
a second ferromagnetic layer including iron atoms above the insulating layer;
an intermediate layer on an upper surface of the second ferromagnetic layer, the intermediate layer including one or more elements identical to one or more elements in the second ferromagnetic layer; and
a conductive capping layer on an upper surface of the intermediate layer, the capping layer including one or more elements identical to one or more of the elements in the intermediate layer, and including a material having a Vickers hardness higher than a Vickers hardness of iron atoms.

17. A memory device comprising:
a first ferromagnetic layer;
an insulating layer above the first ferromagnetic layer;
a second ferromagnetic layer above the insulating layer, the second ferromagnetic layer including iron atoms;
a capping layer on an upper surface of the second ferromagnetic layer, the capping layer including one or more elements identical to one or more elements in the second ferromagnetic layer; and
an electrode on an upper surface of the capping layer, the electrode including one or more elements identical to one or more of the elements in the capping layer and including a material having a Vickers hardness higher than a Vickers hardness of an iron atom,
wherein:
the second ferromagnetic layer further includes boron atoms,
the capping layer is capable of absorbing boron atoms, and
the electrode includes an oxide or nitride.

18. The device according to claim 17, wherein the capping layer includes an oxide, a nitride, or an oxynitride of one or more elements in the second ferromagnetic layer; an oxide, a nitride, or an oxynitride of a compound of two or more elements in the second ferromagnetic layer; or an oxide, a nitride, or an oxynitride of a mixed crystal of two or more elements in the second ferromagnetic layer.

19. The device according to claim 17, wherein:
the capping layer includes an oxide of one or more elements in the second ferromagnetic layer, an oxide of a compound of two or more elements in the second ferromagnetic layer, or an oxide of a mixed crystal of two or more elements in the second ferromagnetic layer, and
the electrode includes an oxide.

20. The device according to claim 17, wherein:
the capping layer includes a nitride of one or more elements in the second ferromagnetic layer, a nitride of a compound of two or more elements in the second ferromagnetic layer, or a nitride of a mixed crystal of two or more elements in the second ferromagnetic layer, and
the electrode includes a nitride.

* * * * *